United States Patent
Zucchetto et al.

(10) Patent No.: US 12,212,343 B2
(45) Date of Patent: Jan. 28, 2025

(54) EFFICIENT CODEC FOR ELECTRICAL SIGNALS

(71) Applicant: EATON INTELLIGENT POWER LIMITED, Dublin (IE)

(72) Inventors: Daniel Zucchetto, Dublin (IE); Niall Cahill, Dublin (IE); Keith Nolan, Mullingar (IE)

(73) Assignee: EATON INTELLIGENT POWER LIMITED, Dublin (IE)

(*) Notice: Subject to any disclaimer, the term of this patent is extended or adjusted under 35 U.S.C. 154(b) by 24 days.

(21) Appl. No.: 18/246,446

(22) PCT Filed: Sep. 28, 2020

(86) PCT No.: PCT/EP2020/077147
§ 371 (c)(1),
(2) Date: Mar. 23, 2023

(87) PCT Pub. No.: WO2022/063418
PCT Pub. Date: Mar. 31, 2022

(65) Prior Publication Data
US 2023/0412191 A1    Dec. 21, 2023

(51) Int. Cl.
*H03M 7/30* (2006.01)
*H03M 7/32* (2006.01)

(52) U.S. Cl.
CPC ....... *H03M 7/3059* (2013.01); *H03M 7/3008* (2013.01)

(58) Field of Classification Search
CPC .................. H03M 7/3059; H03M 7/3008
See application file for complete search history.

(56) References Cited

U.S. PATENT DOCUMENTS 10,284,224 B2 * 5/2019 Pamula ............. H03M 7/3059
11,038,527 B1 * 6/2021 Morrow ............. H03M 7/6058
(Continued)

FOREIGN PATENT DOCUMENTS

CN    106788449 A    5/2017
WO    2005/101032 A1    10/2005

OTHER PUBLICATIONS

Ribeiro M V, et al., "An enhanced data compression method for applications in power quality analysis", IECON' 01. Proceedings of the 27th. Annual Conference of the IEEE Industrial Electronics Society. Denver, co, Nov. 29 Dec. 2, 2001; [Annual Conference of the IEEE Industrial Electronics Society], New York, NY : IEEE, US, vol. 1. Nov. 29, 2001 (Nov. 29, 2001), pp. 676-681, XP010573595, DOI: 10.1109/IECON.2001.976594 ISBN: 978-0-7803-7108-8; paragraph [001.]-paragraph [0VI.].

(Continued)

*Primary Examiner* — Guy J Lamarre
(74) *Attorney, Agent, or Firm* — LEYDIG, VOIT & MAYER, LTD.

(57) ABSTRACT

A method for compressing a signal, the method comprising: acquiring, via a signal recording module, a primary signal; modelling, via a processor, a model signal of the primary signal by: acquiring, via the processor, a sampled signal; acquiring, via the processor, a windowed signal; and extracting, via the processor: a fundamental frequency waveform having a fundamental magnitude and a fundamental phase; and at least one harmonic frequency waveform having a harmonic magnitude and a harmonic phase; wherein the model signal comprises the fundamental frequency waveform and the at least one harmonic frequency waveform; calculating, via the processor, an error signal between a reconstructed signal and the primary signal; determining, via the processor, an optimal gain from at least; an averaging (Continued)

step providing an average value, a predefined threshold, and a scaled signal.

11 Claims, 4 Drawing Sheets

(56) References Cited

U.S. PATENT DOCUMENTS

| | | | |
|---|---|---|---|
| 2009/0287437 A1* | 11/2009 | Turner | H02P 23/14 375/376 |
| 2013/0342357 A1* | 12/2013 | Li | H03M 7/6064 340/870.01 |
| 2022/0270624 A1* | 8/2022 | Biswas | G10L 19/167 |

OTHER PUBLICATIONS

Norman C F Tse, et al., "Real-Time Power-Quality Monitoring With Hybrid Sinusoidal and Lifting Wavelet Compression Algorithm", IEEE Transactions on Power Delivery, IEEE Service Center, New York, NY, US, vol. 27, No. 4, Oct. 1, 2012 (Oct. 1, 2012), pp. 1718-1726, XP011463318, ISSN: 0885-8977, DOI: 10.1109/TPWRD. 2012.2201510 paragraph [00I.]-paragraph [0II.].

Anonymous, "Delta encoding", Wikipedia, Sep. 21, 2020 (Sep. 21, 2020), pp. 1-6, XP055809128, Retrieved from the Internet: URL: https://en.wikipedia.org/w/index.php?title=Delta_encoding&oldid=979623539 [retrieved-on May 31, 2021] p. 1.

Anonymous, "Electrical load", Wikipedia, Jun. 25, 2020 (Jun. 25, 2020), pp. 1-3, XP055808723, Retrieved from the Internet: URL: https://en.wikipedia.org/w/index.php?title=Electrical_load&oldid=964435466 [retrieved on May 28, 2021].

\* cited by examiner

EFFICIENT CODEC FOR ELECTRICAL SIGNALS

FIELD OF THE INVENTION

The present invention relates to a method for compressing and decompressing an electrical signal.

BACKGROUND TO THE INVENTION

Energy management systems may capture significant data related to voltage and current waveforms for end-use energy or load monitoring. Data captured by energy management systems needs a high sampling rate in order to infer the electrical load (i.e. types of machine or appliance present in the circuit) or to predict when maintenance is required for equipment in the circuit.

In certain scenarios, it may be necessary to transmit this data significant distances, via a network. It is often the case that said network is constrained such that the data rate required to transmit the voltage and current waveforms may be too large. The data rate required is often too large for even the most advanced data transfer methods such as fibre optic.

Accordingly, a technique to reduce the data size is required.

Current methods of compressing signals are based on minimising the average error between the original signal and the reconstructed signal. However, inferring the types of machine or appliance is based on high-order components of the signal. Therefore, current compression methods which minimise a mean square error, for example, may remove these high-order components which allow the system to extract information about the electrical load.

Further signal compression methods exist wherein the signal is compressed based on psychoacoustic models. However, these methods are also unsuitable for inferring the electrical load from an electrical signal.

Therefore, an improved way of compressing and decompressing signals is required.

SUMMARY OF THE INVENTION

In accordance with a first aspect of the present invention, there is provided a method for compressing a signal, the method comprising: acquiring, via a signal recording module, a primary signal; modelling, via a processor, a model signal of the primary signal by: acquiring, via the processor, a sampled signal; acquiring, via the processor, a windowed signal; and extracting, via the processor: a fundamental frequency waveform having a fundamental magnitude, a fundamental phase and a fundamental frequency; and at least one harmonic frequency waveform having a harmonic magnitude, a harmonic phase and a harmonic frequency; wherein the model signal comprises the fundamental frequency waveform and the at least one harmonic frequency waveform; calculating, via the processor, an error signal between a reconstructed signal and the primary signal; determining, via the processor, an optimal gain from at least; an averaging step providing an average value, a predefined threshold, and a scaled signal, wherein the scaled signal is a historical error signal scaled by a predefined gain by iteratively: averaging a difference between the error signal and the scaled signal, wherein the optimal gain comprises the predefined gain when the average value meets the predefined threshold; determining, via the processor, an index from a residual signal by: determining the residual signal; vector quantising the residual signal; and indexing the vector quantised residual signal; composing, via the processor, a compressed signal, wherein the compressed signal comprises: the fundamental phase; the fundamental magnitude; the fundamental frequency; the harmonic phase; the harmonic magnitude; the harmonic frequency; the optimal gain; the index. In this way, the primary signal may be compressed, thereby producing a compressed signal comprising components that may allow for the signal to be transmitted at a lower data rate than the primary signal. It should be noted by the skilled addressee that each of the at least one harmonic frequency waveforms comprise a harmonic phase, harmonic magnitude and harmonic frequency.

The term "model signal" will be understood by the skilled addressee as referring to the signal that has been modelled. The term "fundamental magnitude" will be understood by the skilled addressee as referring to the magnitude of the fundamental signal, the term "fundamental phase" will be understood as referring to the phase of the fundamental signal and the term "fundamental frequency" will be understood as referring to the frequency of the fundamental signal. Similarly, the terms "harmonic magnitude", "harmonic phase" and "harmonic frequency" will be understood as referring to the magnitude, phase and frequency of the harmonic signal, respectively.

Preferably, the sample signal is acquired by sampling, via the processor, the primary signal at the Nyquist rate. In this way, the primary signal may be compressed by the processor sampling the primary signal at the lowest sampling rate without introducing errors to the compressed signal such as aliasing.

It shall be understood by the skilled addressee that further sampling rates are conceivable wherein the sampling rate is any rate suitable for capturing the primary signal.

Preferably, the windowed signal is acquired by applying, via the processor, a window function to the sampled signal. Further preferably, the windowed function is a hamming window. In this way, spectral leakage may be reduced.

It shall be understood by the skilled addressee that any window function suitable for minimising the effects of spectral leakage may be used.

Preferably, the fundamental frequency and the at least one harmonic frequency are extracted by applying, via the processor, a Fast Fourier Transform to the windowed signal. Further preferably, the fundamental frequency and six harmonic frequencies are extracted. In this way, the primary signal may be further compressed to seven frequency components whilst still retaining more information than if only the fundamental frequency waveform was extracted.

It shall be understood by the skilled addressee than any number of harmonic frequencies may be extracted. In this way, a higher number of harmonic frequencies may more accurately capture the primary signal and a lower number of harmonic frequencies may further compress the primary signal.

Preferably, the reconstructed signal is based on the model signal. In this way, the reconstructed signal may represent a compressed version of the primary signal, comprising the magnitude, phase and frequency of the fundamental signal and the magnitude and phase of each of the harmonic signals.

Preferably, the error signal is calculated by subtracting the reconstructed signal from the primary signal. In this way, the difference between the reconstructed signal and the primary signal may be acquired, the difference indicating the loss of signal information.

Preferably, determining the optimal gain comprises the iterative steps of: i. encoding, via the processor, the scaled signal; wherein the scaled signal is encoded by multiplying, via the processor, the historical error signal by the predefined gain; ii. subtracting, via the processor, the scaled signal from the error signal, thereby creating the difference; iii. calculating, via the processor, the average value of the resulting signal; iv. comparing, via the processor, the average value to the predefined threshold; and v. repeating steps i. to iv. wherein the predefined gain is a new gain. In this way, delayed components of the error signal may be extracted, the delayed components representing a recurring signal common to error signals across multiple time periods. Further advantageously, an optimal value for gain may be reached, thereby providing the best compression ratio.

In preferable embodiments, the historical error signal is an error signal from a previous time interval, stored in a data store. In this way, error signals of previous time periods may be stored in order to extract delayed components in the error signals.

Preferably, the new gain is calculated, via the processor, using a stochastic descent algorithm. In this way, an optimal gain value may be reached in fewer iterations of the steps i to v.

It shall be understood by the skilled addressee that any algorithm suitable for converging on an optimal gain may be used.

Preferably, the residual signal is encoded by determining the difference between the error signal and the historical error signal. In this way, a signal may be created comprising information relating to the difference between the error signals of two different time intervals.

Preferably, the residual signal is vector quantised with respect to a predefined codebook, wherein the predefined codebook is stored in the data store. Advantageously, vector quantising the residual signal compresses the residual signal. Further preferably, the predefined codebook comprises indexes configured to provide the best compression ratio. Advantageously, the vector quantisation points (i.e. the indexes) may be chosen such that the least amount of data is lost during the vector quantisation step. In further preferred embodiments, the predefined codebook is trained as more primary signals are compressed. In this way, as more primary signals are compressed, the predefined codebook may improve the indexes.

Preferably, the residual signal is delta encoded, thereby producing a delta encoded coefficient. In this way, the residual signal is stored as a difference between the error signal and the historical error signal. Further preferably, the residual signal is only delta encoded if the predefined codebook has not been trained to a suitable level.

Preferably, the compressed signal is stored in the data store or transmitted via a transmitter. In this way, the compressed signal may be either stored or transmitted.

In accordance with a second aspect of the present invention, there is provided a method for decompressing a compressed signal, the method comprising: extracting, via a processor, a residual signal; and reconstructing, via the processor, a primary signal.

In some embodiments, the compressed signal comprises: a fundamental phase; a fundamental magnitude; a fundamental frequency; a harmonic phase; a harmonic magnitude; a harmonic frequency; an optimal gain; and an index. Advantageously, these components of the compressed signal may be used to reconstruct signal that has been compressed.

In further embodiments, the compressed signal comprises: a fundamental phase; a fundamental magnitude; a fundamental frequency; a harmonic phase; a harmonic magnitude; a harmonic frequency; an optimal gain; and a delta encoded coefficient. Advantageously, these components of the compressed signal may be used to reconstruct signal that has been compressed.

In some embodiments, extracting the residual signal comprises: comparing, via the processor, the index to a predefined codebook, wherein the predefined codebook is stored in a data store; and recreating, via the processor, the residual signal based on the index. In this way, the index may be found in the predefined codebook and subsequently used to reconstruct the residual signal.

In further embodiments, extracting the residual signal comprises: decoding, via the processor, the delta encoded coefficient; and recreating, via the processor, the residual signal based on the decoded delta encoded coefficient. In this way, the delta encoded coefficient may be used instead of the index to reconstruct the residual signal.

Preferably, reconstructing the primary signal comprises: summing, via the processor, the residual signal with a historic residual signal multiplied by the optimal gain, thereby creating a summed residual signal; recreating, via the processor, a sinusoidal component of the primary signal based on: the fundamental phase; the fundamental magnitude; the fundamental frequency, the harmonic phase; the harmonic magnitude, and the harmonic frequency; summing, via the processor, the summed residual signal and the sinusoidal component, thereby reconstructing the primary signal. In this way, the primary signal may be reconstructed using the components of the compressed signal.

Preferably, the historical residual signal is a residual signal from a previous time interval stored in the data store.

In accordance with a third aspect of the present invention, there is provided a method for compressing and decompressing a signal comprising the method according the first aspect of the present invention and the second aspect of the present invention.

In accordance with a fourth aspect of the present invention, there is provided a system for compressing a signal, the system comprising: a signal recording module configured to acquire a primary signal; a data store comprising: a historical error signal; a predefined codebook; and a compressed signal; a compression unit configured to compress the primary signal, the compression unit comprising a processor configured to: model a model signal; calculate an error signal; determine a optimal gain; determine an index; determine a delta encoded coefficient and compose the compressed signal; a transmitter configured to transmit the compressed signal.

Preferably, the processor is further configured to: acquire a sampled signal; acquire a windowed signal; apply a Fast Fourier Transform to the windowed signal; extract a fundamental frequency waveform and at least one harmonic frequency waveform; calculate a reconstructed signal; subtract the reconstructed signal from the primary signal; multiply the historical error signal by the predefined gain, thereby obtaining a scaled signal; average a difference between the error signal and the scaled signal; subtract the scaled signal from the error signal, thereby creating a resulting signal; calculate the average value of the resulting signal; compare the average value to the predefined threshold; repeat the step of extracting the delayed component using a new gain until the average value meets the predefined threshold; calculate the new gain using a stochastic descent algorithm; vector quantise the residual signal with respect to the predefined codebook; delta encode the coefficients; and compose the compressed signal by combining: the fundamental phase; the fundamental magnitude; the fundamental frequency; the harmonic phase; the harmonic magnitude; the harmonic frequency; the optimal gain; and the index or the delta encoded coefficient.

In accordance with a fifth aspect of the present invention, there is provided a system for decompressing a compressed signal, the system comprising: a receiver configured to receive a compressed signal, the compressed signal comprising: a fundamental phase; a fundamental magnitude; a fundamental frequency; a harmonic phase; a harmonic magnitude; a harmonic frequency; an optimal gain; and an index or a delta encoded coefficient; a data store comprising: a predefined codebook; and a historic residual signal; a decompression unit comprising a processor, the processor being configured to: extract a residual signal; multiply the historical residual signal by the optimal gain; sum the residual signal with the multiplied historic residual signal, thereby creating the summed residual signal; recreate the primary signal; sum the primary signal and the summed residual signal.

DETAILED DESCRIPTION

Specific embodiments will now be described by way of example only, and with reference to the accompanying drawings, in which.

Figure 1:
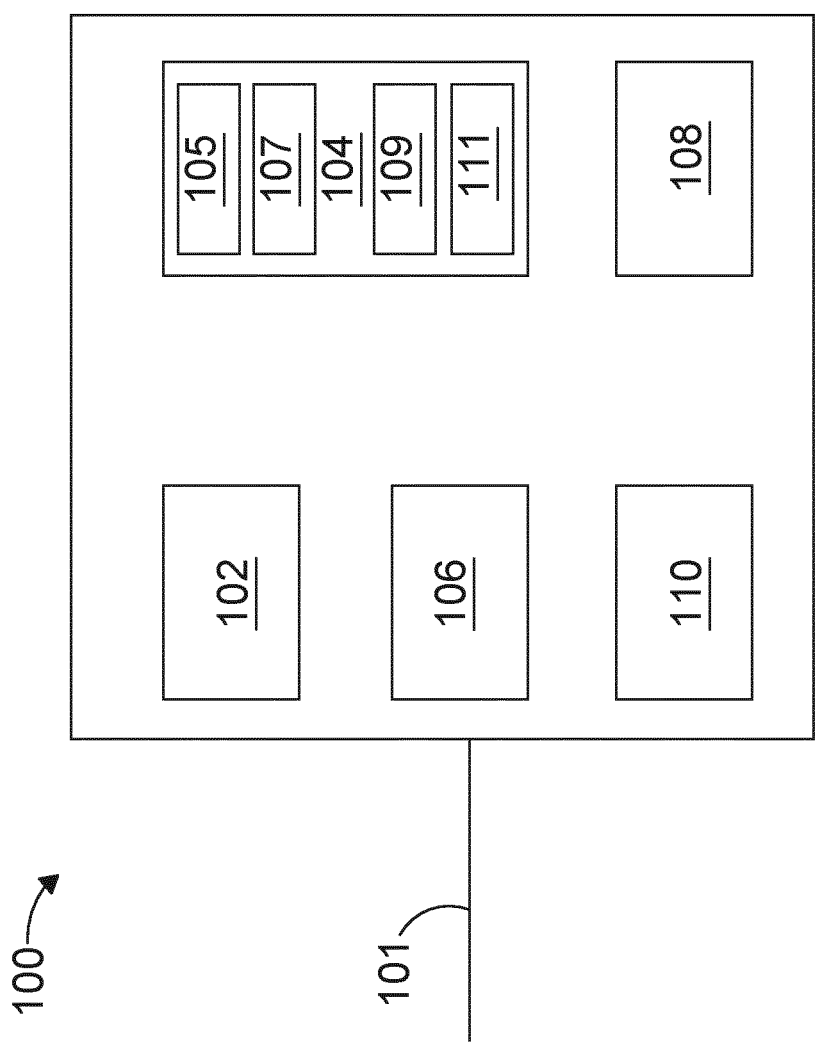
FIG. 1 shows a schematic view of an energy management system in a circuit.

Referring to FIG. 1, there is shown a schematic view of an energy management system 100 in a circuit 101. The energy management system 100 comprises a signal recording module 102, a data store 104, a compression unit 106, a transmitter 108 and a processor 110. The data store 104 comprises a historic error signal 105, a predefined gain 107, a predefined threshold 109 and a codebook 111. The codebook 111 comprises a number of indexes.

Figure 2:
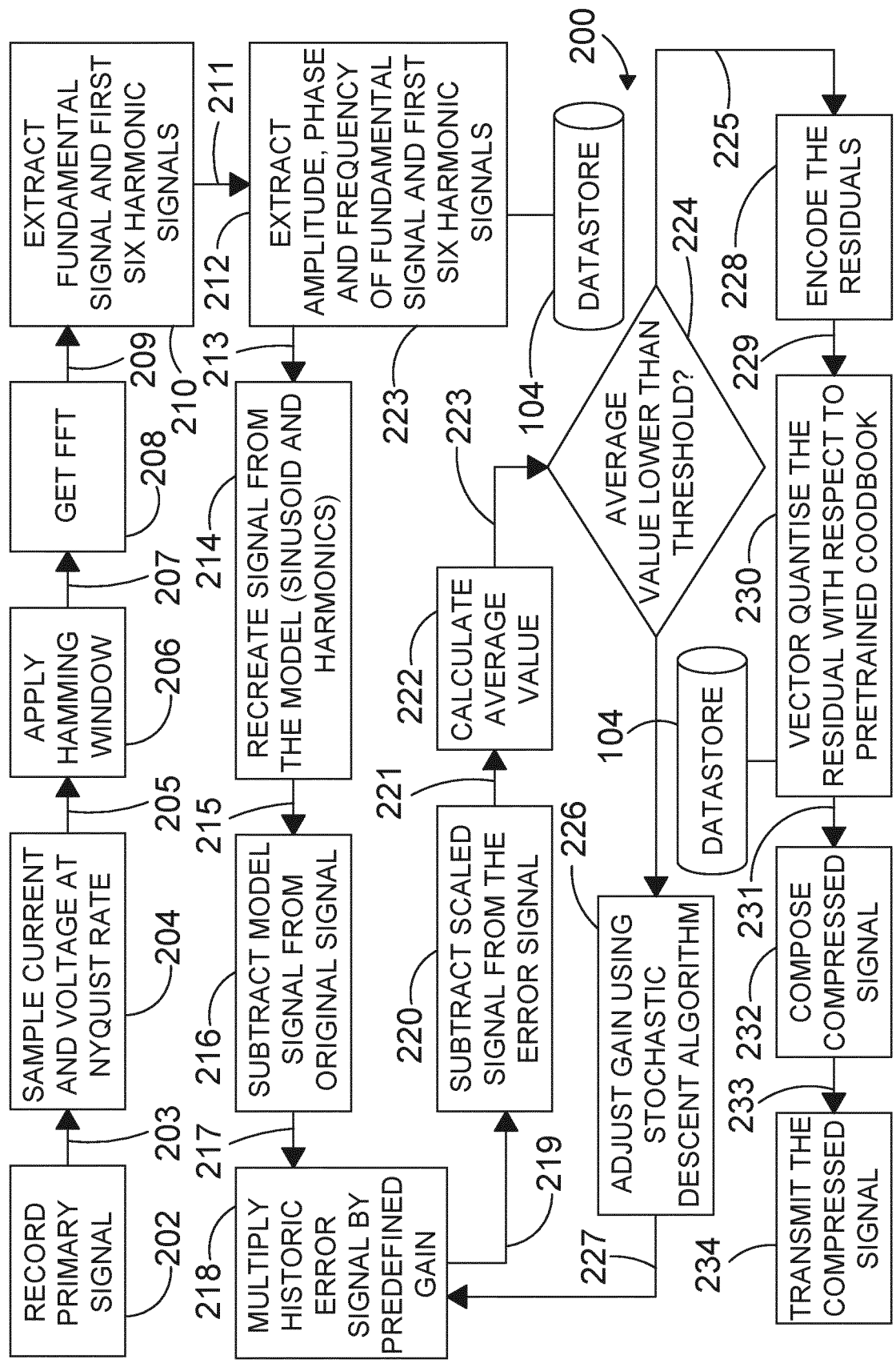
FIG. 2 shows a schematic view of a compression method for compressing a signal in accordance with the first aspect of the present invention.

In use, and with reference to FIG. 2, there is shown a compression method 200 for compressing a signal in accordance with the first aspect of the present invention.

At step 202, the signal recording module 102 records a primary signal 203. The primary signal may be a current or voltage signal corresponding to the circuit 101.

At step 204, the processor 110 samples the primary signal at the Nyquist rate, thereby creating a sampled signal 205.

At step 206, the processor 110 applies a hamming window to the sampled signal 205, thereby creating a windowed signal 207.

At step 208, the processor 110 applies a Fast Fourier Transform to the windowed signal 207, thereby creating a spectrum 209 of the windowed signal 207.

At step 210, the processor 110 extracts a fundamental signal and a first six harmonic signals from the spectrum 209.

At step 212, the processor 110 extracts a fundamental magnitude, a fundamental phase and a fundamental frequency from the fundamental signal of the spectrum 209. The processor 110 further extracts a harmonic magnitude, a harmonic phase and a harmonic frequency from each of the six harmonic signals of the spectrum 209. The fundamental magnitude, fundamental phase, harmonic magnitude and harmonic phase are stored in the data store 104.

At step 214, the processor 110 recreates a model signal 215 using the fundamental magnitude, the fundamental phase, the fundamental frequency, the harmonic magnitude, the harmonic phase, and the harmonic frequency.

At step 216, the processor 110 subtracts the model signal 215 from the primary signal 205, thereby creating an error signal 217.

At step 218, the processor 110 initiates an iterative process by multiplying the historic error signal 105 by the predefined gain 107. The multiplication by the predefined gain 107 thereby creates a scaled signal 219.

At step 220, the processor 110 subtracts the scaled signal 219 from the error signal 217. The subtractions of the scaled signal 2019 from the error signal 217 thereby creates a resulting signal 221.

At step 222, the processor 110 calculates the average value of the difference and compares the average value with the predefined threshold 109.

At step 224, if the average value meets the predefined threshold 109, then step 226 does not occur and the predefined gain is output as an optimal gain 225. If the average value does not meet the predefined threshold 109, then step 226 occurs.

At step 226, the predefined gain is adjusted to a new gain 227 using a stochastic descent algorithm and steps 218 to 224 are repeated with the predefined gain 107 being the new gain 227.

At step 228, the processor 110 subtracts the error signal 217 from the historical error signal 105, thereby creating a residual signal 229.

At step 230, the processor 110 compares the residual signal 229 to the indexes in the codebook 111 in order to vector quantise the residual signal 229 as a number of residual indexes 231.

At step 232, the processor 110 composes a compressed signal 233 comprising the fundamental magnitude, the fundamental phase, the fundamental frequency, the harmonic magnitude, the harmonic phase, the harmonic frequency, the optimal gain 225 and the residual indexes 231. It should be noted that the compressed signal 233 comprises the harmonic magnitude, the harmonic phase and the harmonic frequency of each of the six harmonic waveforms.

At step 234, the transmitter 108 transmits the compressed signal 233.

Figure 3:
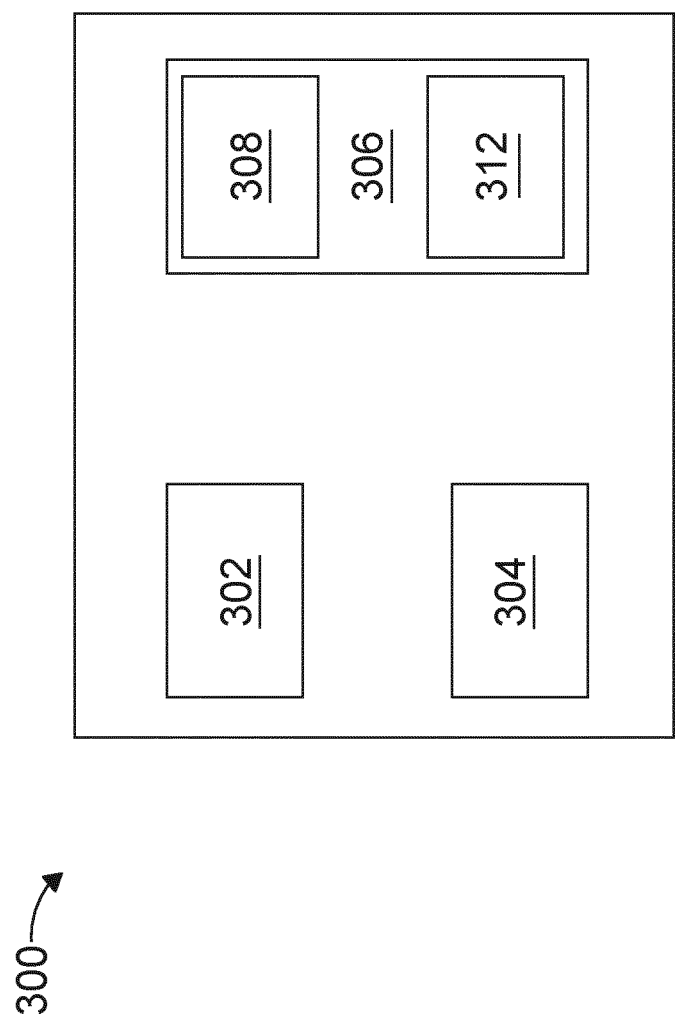
FIG. 3 shows a schematic view of a decompression unit.

With reference to FIG. 3, there is shown a schematic view of a decompression unit 300.

The decompression unit 300 comprises a processor 302, a receiver 304 and a data store 306. The data store 306 comprises a codebook 308 and a historic residual signal 312. The codebook 308 is substantially similar to the codebook 111 as described in FIG. 1 and comprises a number of indexes.

Figure 4:
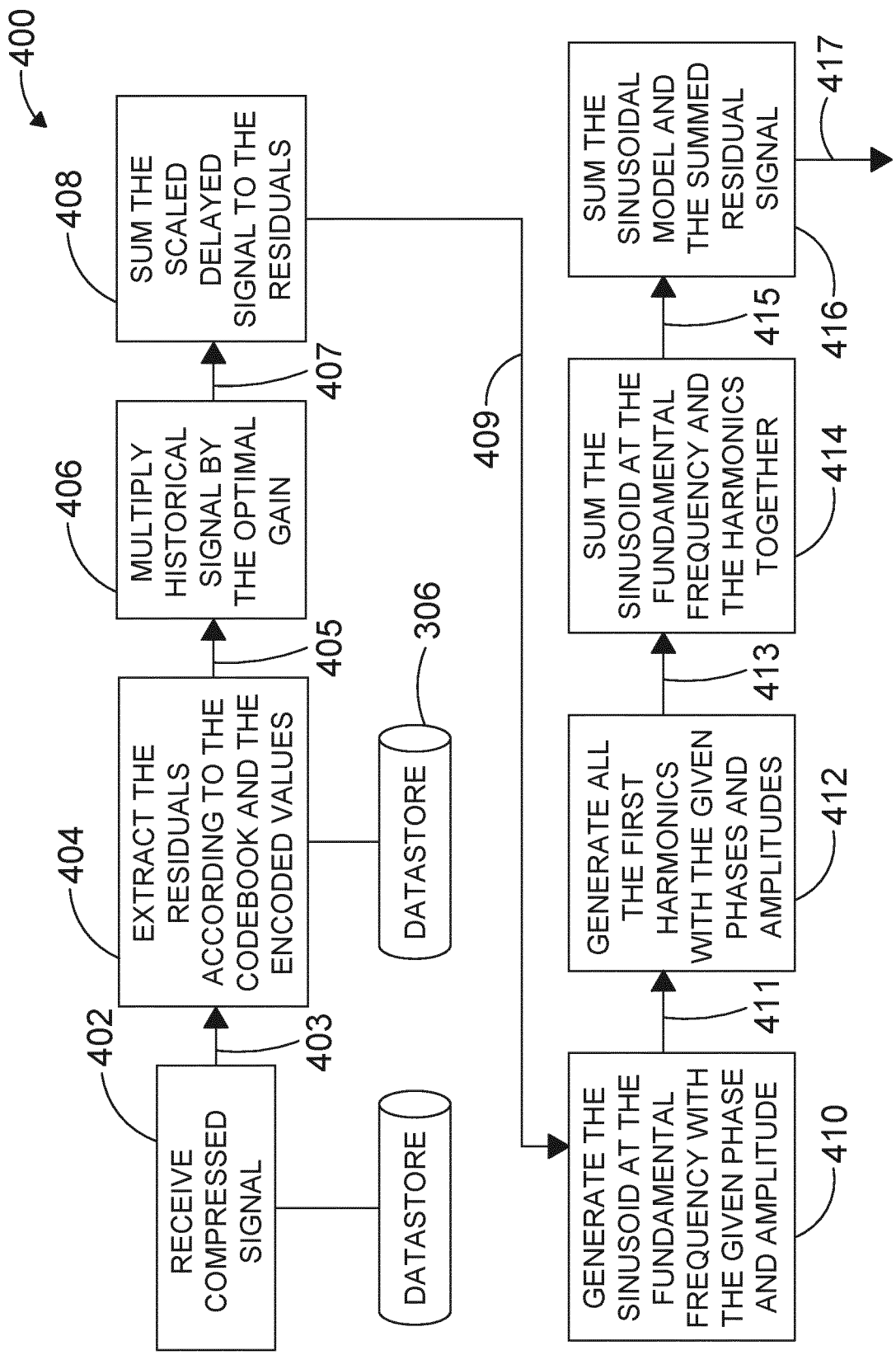
FIG. 4 shows a schematic view of a decompression method for decompressing a compressed signal in accordance with the second aspect of the present invention.

In use, and with reference to FIG. 4, there is shown a schematic view of a decompression method 400 for decompressing the compressed signal 233 in accordance with the second aspect of the present invention.

At step 402, receiver 304 receives the compressed signal 233 and stores the compressed signal 233 in the data store 306. The compressed signal 233 comprises the fundamental magnitude, the fundamental phase, the fundamental frequency, the harmonic magnitude, the harmonic phase, the harmonic frequency, the optimal gain 225 and the residual indexes 231.

At step 404, the processor 302 compares the residual indexes 231 to the indexes in the codebook 308 and creates a reconstructed residual signal 405 based on the indexes that match the residual indexes 231. The reconstructed residual signal 405 will be similar, but with some information lost, to the residual signal 229.

At step 406, the processor multiplies the historic residual signal 312 by the optimal gain 225, thereby creating a scaled historic residual signal 407.

At step 408, the processor sums the reconstructed residual signal 405 with the scaled historic residual signal 407, thereby creating a summed residual signal 409.

At step 410, the processor combines the fundamental magnitude, the fundamental phase, the fundamental frequency, thereby creating a fundamental sinusoidal signal 411.

At step 412, the processor combines the harmonic magnitude, the harmonic phase, and the harmonic frequency, thereby creating a harmonic sinusoidal signal 413.

At step 414, the processor sums the fundamental sinusoidal signal 411 with the harmonic sinusoidal signal 413, thereby creating a sinusoidal signal 415.

At step 416, the processor sums the sinusoidal signal 415 with the summed residual signal 409, thereby creating a decompressed signal 417. The decompressed signal 417 is substantially similar to the primary signal 203 but with some information lost.

It will be appreciated that the above described embodiments are given by way of example only and that various modifications may be made to the described embodiments without departing from the scope of the invention as defined by the appended claims. For example, the primary signal may be current, voltage or any other circuit indicator. Further, there could be any number of harmonic signals extracted from the primary signal. Further, the primary signal may be sampled at any sampling rate and any windowing function may be applied to the sampled signal. Further, any suitable algorithm may be used to converge on an optimal gain value.

The invention claimed is:

1. A method for compressing a primary signal, the method comprising:
  acquiring, via a signal recording module, the primary signal;
  modelling, via a processor, a model signal of the primary signal by:
    acquiring, via the processor, a sampled signal from the primary signal;
    acquiring, via the processor, a windowed signal from the sampled signal; and
    extracting from the windowed signal, via the processor:
      a fundamental frequency waveform having a fundamental magnitude, a fundamental phase, and a fundamental frequency;
      at least one harmonic frequency waveform having a harmonic magnitude, a harmonic phase, and a harmonic frequency; and
      recreating the model signal from the fundamental frequency waveform and the at least one harmonic frequency waveform;
  calculating, via the processor, an error signal between the model signal and the primary signal;
  determining, via the processor, an optimal gain by iteratively:
    i) multiplying a historical error signal with a predetermined gain to create a scaled signal;
    ii) averaging a difference between the error signal and the scaled signal to obtain an average value;
    iii) comparing the average value with a predetermined threshold; and
    upon determining that the average value meets the predetermined threshold, setting the optimal gain to the predetermined gain;
    upon determining that the average value does not meet the predetermined threshold, adjusting the predetermined gain, and repeating steps i), ii), and iii) with the adjusted predetermined gain;
  subtracting the error signal from the historical error signal to create a residual signal; and
  vector quantising the residual signal as a number of residual indexes; and
  composing, via the processor, a compressed signal, wherein the compressed signal comprises:
    the fundamental phase;
    the fundamental magnitude;
    the fundamental frequency;
    the harmonic phase;
    the harmonic magnitude;
    the harmonic frequency;
    the optimal gain; and
    the residual indexes.

2. The method of claim 1, wherein:
  the sample signal is acquired by sampling, via the processor, the primary signal at the Nyquist rate;
  the windowed signal is acquired by applying, via the processor, a window function to the sampled signal; and
  the fundamental frequency waveform and the at least one harmonic frequency waveform are extracted by applying, via the processor, a Fast Fourier Transform to the windowed signal.

3. The method of claim 1, wherein the predetermined gain is adjusted, via the processor, using a stochastic descent algorithm.

4. The method of claim 1, wherein the residual signal is vector quantised with respect to a predefined codebook, wherein the predefined codebook is stored in a data store of an energy management system.

5. The method of claim 1, wherein the residual signal is delta encoded, thereby producing a delta encoded coefficient.

6. A method for decompressing a compressed primary signal obtained through the method as claimed in claim 1, the method comprising:
  extracting, via a processor, the fundamental phase, the fundamental magnitude, the fundamental frequency, the harmonic phase, the harmonic magnitude, the harmonic frequency, the optimal gain, and the residual indexes; and
  reconstructing, via the processor, a decompressed primary signal from the fundamental phase, the fundamental magnitude, the fundamental frequency, the harmonic phase, the harmonic magnitude, the harmonic frequency. the optimal gain, and the residual indexes.

7. The method according to claim 6, further comprising recreating the residual signal by:
  comparing, via the processor, the residual indexes to a predefined codebook,
  wherein the predefined codebook is stored in a data store; and
  recreating, via the processor, the residual signal with respect to the predefined codebook based on the residual indexes.

8. The method according to claim 6, wherein reconstructing the decompressed primary signal comprises:

summing, via the processor, the residual signal with a historic residual signal multiplied by the optimal gain, thereby creating a summed residual signal;

recreating, via the processor, a sinusoidal component of the decompressed primary signal based on:
 the fundamental phase;
 the fundamental magnitude;
 the fundamental frequency;
 the harmonic phase;
 the harmonic magnitude; and
 the harmonic frequency;

summing, via the processor, the summed residual signal and the sinusoidal component, thereby reconstructing the decompressed primary signal.

9. The method according to claim 8, wherein the historical residual signal is a previous residual signal from a previous time interval stored in the data store.

10. A system for decompressing a compressed primary signal, the system comprising:
 a receiver configured to receive the compressed primary signal;
 a data store comprising:
  a predefined codebook; and
  a historic residual signal; and
 a decompression unit comprising a processor, the processor being configured to implement a decompression method as claimed in claim 6.

11. A system for compressing a primary signal, the system comprising:
 a signal recording module configured to acquire the primary signal;
 a data store comprising:
  a historical error signal;
  a predefined codebook; and
 a processor configured to: implement a compression method as claimed in claim 1; and
 a transmitter configured to transmit the compressed primary signal.

* * * * *